(12) United States Patent
Ono et al.

(10) Patent No.: US 7,622,771 B2
(45) Date of Patent: Nov. 24, 2009

(54) SEMICONDUCTOR APPARATUS

(75) Inventors: Syotaro Ono, Kanagawa-ken (JP); Wataru Saito, Kanagawa-ken (JP); Masakatsu Takashita, Kanagawa-ken (JP); Yasuto Sumi, Hyogo-ken (JP); Masaru Izumisawa, Hyogo-ken (JP); Hiroshi Ohta, Tokyo (JP); Wataru Sekine, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 30 days.

(21) Appl. No.: 12/123,072

(22) Filed: May 19, 2008

(65) Prior Publication Data

US 2008/0290403 A1    Nov. 27, 2008

(30) Foreign Application Priority Data

May 24, 2007 (JP) ............................. 2007-137938

(51) Int. Cl.
*H01L 31/119* (2006.01)
*H01L 21/336* (2006.01)

(52) U.S. Cl. ........................................ 257/341; 438/268

(58) Field of Classification Search ................ 257/328, 257/330, 341–342, E21.609, E29.187; 438/268–269
See application file for complete search history.

(56) References Cited

U.S. PATENT DOCUMENTS 6,674,126 B2    1/2004    Iwamoto et al.
6,844,592 B2 *  1/2005    Yamaguchi et al. ......... 257/341
7,161,209 B2 *  1/2007    Saito et al. .................. 257/341
2006/0043480 A1  3/2006    Tsuchitani et al.
2007/0272977 A1  11/2007   Saito et al.
2007/0272979 A1  11/2007   Saito et al.

FOREIGN PATENT DOCUMENTS

JP    2000-277726    10/2000
JP    2005-101560    4/2005

OTHER PUBLICATIONS

U.S. Appl. No. 12/144,985, filed Jun. 24, 2008, Takashita et al.

* cited by examiner

*Primary Examiner*—Calvin Lee
(74) *Attorney, Agent, or Firm*—Oblon, Spivak, McClelland, Maier & Neustadt, L.L.P.

(57) ABSTRACT

A semiconductor apparatus includes a first semiconductor layer, a second semiconductor layer provided on a major surface of the first semiconductor layer, a third semiconductor layer provided on the major surface and being adjacent to the second semiconductor layer, a termination semiconductor layer provided on the major surface of the first semiconductor layer in a termination region outside the device region, a channel stop layer, and a channel stop electrode. The channel stop layer is provided in contact with the termination semiconductor layer on the major surface of the first semiconductor layer in an outermost peripheral portion outside the termination semiconductor layer and has a higher impurity concentration than the termination semiconductor layer. The channel stop electrode is provided on at least part of a surface of the channel stop layer and projects toward the termination semiconductor layer beyond at least a superficial portion of the channel stop layer.

20 Claims, 8 Drawing Sheets

SEMICONDUCTOR APPARATUS

CROSS-REFERENCE TO RELATED APPLICATIONS

This application is based upon and claims the benefit of priority from the prior Japanese Patent Application No. 2007-137938, filed on May 24, 2007; the entire contents of which are incorporated herein by reference.

BACKGROUND OF THE INVENTION

1. Field of the Invention

This invention relates to a semiconductor apparatus, and more particularly to a vertical semiconductor apparatus suitable for power electronics applications.

2. Background Art

The on-resistance of a vertical power MOSFET (metal-oxide-semiconductor field effect transistor) greatly depends on the electric resistance of its drift layer. The impurity concentration that determines the electric resistance of the drift layer cannot exceed a maximum limit, which depends on the breakdown voltage of the pn junction between the base and the drift layer. Thus there is a tradeoff between the device breakdown voltage and the on-resistance. Improving this tradeoff is important for low power consumption devices. This tradeoff has a limit determined by the device material. Overcoming this limit is the way to realizing devices with low on-resistance beyond existing power devices.

As an example MOSFET to solve this problem, JP-A 2000-277726 (Kokai) (hereinafter referred to as Patent Document 1) discloses a structure with p-type pillar layers and n-type pillar layers buried in the drift layer of the device region, which is known as a superjunction structure. In the superjunction structure, a non-doped layer is artificially produced by equalizing the amount of impurities contained in the p-type pillar layer with that contained in the n-type pillar layer. Thus, while holding a high breakdown voltage, a current is passed through the highly doped n-type pillar layer, realizing a low on-resistance beyond the material limit.

In a power device, in addition to the device region, the termination region also needs to hold a high breakdown voltage. As a structure for achieving a high breakdown voltage in the termination region, structures with a field plate, a RESURF (reduced surface field), or a field limited ring formed in the surface of the termination region are known. In these structures, a depletion layer can be extended toward the outside. However, excessive extension of the depletion layer to the surface and edge of the chip end results in decreased breakdown voltage, which is to be prevented. As an example structure for restricting the extension of the depletion layer, Patent Document 1 discloses a structure in which an $n^+$-type stopper layer is provided in the surface of the chip end.

However, if the depletion layer is abruptly stopped by the stopper layer while it is insufficiently extended, a point of electric field concentration may locally occur. If a point of electric field concentration locally occurs in the termination region and causes the decrease of breakdown voltage, the device breakdown voltage is unfortunately determined by the termination breakdown voltage. Furthermore, because of the low termination breakdown voltage, the avalanche current concentrates exclusively on the termination section, also causing the device destruction.

SUMMARY OF THE INVENTION

According to an aspect of the invention, there is provided a semiconductor apparatus including: a first semiconductor layer of a first conductivity type; a second semiconductor layer of the first conductivity type provided on a major surface of the first semiconductor layer in a device region in which a main current path is produced in a vertical direction generally perpendicular to the major surface of the first semiconductor layer; a third semiconductor layer of a second conductivity type provided on the major surface of the first semiconductor layer and being adjacent to the second semiconductor layer; a first main electrode provided on a surface of the first semiconductor layer opposite to the major surface thereof; a second main electrode provided in contact with a surface of the device region; a termination semiconductor layer provided on the major surface of the first semiconductor layer in a termination region outside the device region; a channel stop layer of the first conductivity type provided in contact with the termination semiconductor layer on the major surface of the first semiconductor layer in an outermost peripheral portion outside the termination semiconductor layer and having a higher impurity concentration than the termination semiconductor layer; and a channel stop electrode provided on at least part of a surface of the channel stop layer and projected toward the termination semiconductor layer beyond at least a superficial portion of the channel stop layer.

DETAILED DESCRIPTION OF THE INVENTION

Figure 1:
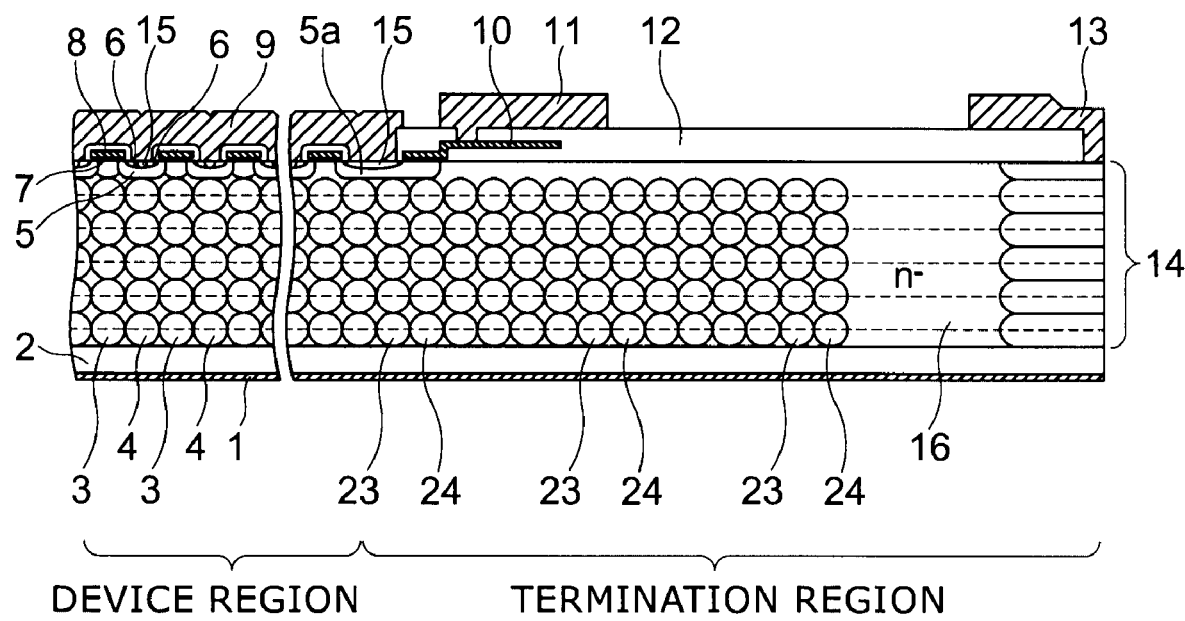
FIG. 1 is a schematic view showing the principal cross-sectional structure of a semiconductor apparatus according to a first embodiment of the invention.

The semiconductor apparatus according to the embodiments of the invention will now be described with reference to the drawings, taking a power MOSFET as an example. In the following embodiments, it is assumed that the first conductivity type and the second conductivity type are n-type and p-type, respectively. Like elements in the drawings are marked with like reference numerals.

FIRST EMBODIMENT

FIG. 1 is a schematic view showing the principal cross-sectional structure of a semiconductor apparatus according to a first embodiment of the invention.

Figure 2:
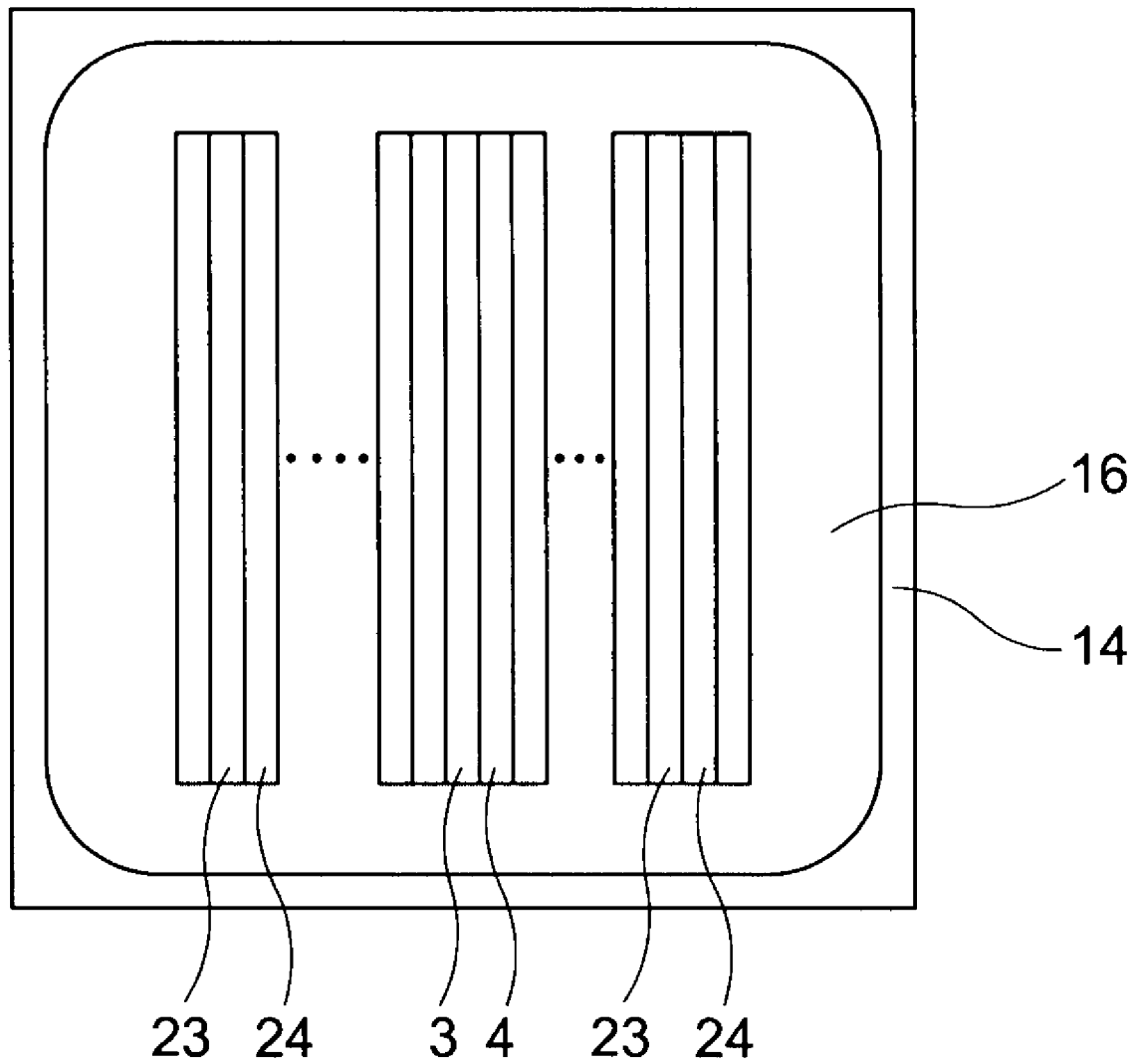
FIG. 2 is a schematic view illustrating a planar pattern of a superjunction structure and a channel stop layer 14 in the semiconductor apparatus.

FIG. 2 is a schematic view illustrating a planar pattern of a superjunction structure and a channel stop layer 14 in the semiconductor apparatus.

The semiconductor apparatus according to this embodiment is a vertical device having a main current path in the vertical direction (the direction generally perpendicular to the major surface of its semiconductor layer) connecting between a first main electrode and a second main electrode, which are provided on the frontside and backside of the semiconductor layer, respectively. The semiconductor apparatus according to this embodiment includes a device region having its main current path and a termination region surrounding outside the device region.

In the device region, an n-type pillar layer 3, which is a second semiconductor layer of n-type silicon, and a p-type pillar layer 4, which is a third semiconductor layer of p-type silicon, are provided on the major surface of a drain layer 2, which is a first semiconductor layer of highly doped n$^+$-type silicon.

The n-type pillar layers 3 and the p-type pillar layers 4 are periodically arrayed adjacent (in pn junction) to each other in the lateral direction generally parallel to the major surface of the drain layer 2, constituting a so-called "superjunction structure". The bottom of the n-type pillar layer 3 is in contact with the drain layer 2 and constitutes part of the main current path during on-time.

In the termination region, an n-type pillar layer 23, which is a fourth semiconductor layer of n-type silicon, and a p-type pillar layer 24, which is a fifth semiconductor layer of p-type silicon, are provided on the major surface of the drain layer 2. That is, the termination region also includes a superjunction structure in which the n-type pillar layers 23 and the p-type pillar layers 24 are periodically arrayed adjacent (in pn junction) to each other in the lateral direction generally parallel to the major surface of the drain layer 2.

The planar pattern of the n-type pillar layer 3, the p-type pillar layer 4, the n-type pillar layer 23, and the p-type pillar layer 24 is illustratively a striped configuration as shown in FIG. 2. However, it is not limited thereto, but may be formed in a lattice or staggered configuration.

A base region 5 of p-type silicon is provided on the p-type pillar layer 4 in the device region. Like the p-type pillar layer 4, the base region 5 is adjacent to and in pn junction with the n-type pillar layer 3. A source region 6 of n$^+$-type silicon is selectively provided in the surface of the base region 5.

A gate insulating film 7 illustratively made of silicon oxide is provided on the portion extending from the n-type pillar layer 3 through the base region 5 to the source region 6. A control electrode (gate electrode) 8 is provided on the gate insulating film 7.

A source electrode 9 is provided as a second main electrode on part of the source regions 6 and the portion of the base region 5 located between the source regions 6. The source electrode 9 is in contact with the surface of the source region 6 and electrically connected to the source region 6. The source electrode 9 is also in contact with a base contact region 15 of p$^+$-type silicon formed in the surface of the base region 5, and thereby the base region 5 is fixed to the source potential. At the surface of the drain layer 2 opposite to the major surface, a drain electrode 1 is provided as a first main electrode and electrically connected to the drain layer 2.

When a prescribed voltage is applied to the control electrode 8, a channel is produced near the surface of the base region 5 directly below the control electrode 8, establishing electrical continuity between the source region 6 and the n-type pillar region 3. Consequently, a main current path is produced between the source electrode 9 and the drain electrode 1 through the source region 6, the n-type pillar region 3, and the drain layer 2, resulting in the on-state between the electrodes 9 and 1.

The superjunction structure in the termination region (the periodic array structure of the n-type pillar layers 23 and the p-type pillar layers 24) has a lower impurity concentration than the superjunction structure in the device region (the periodic array structure of the n-type pillar layers 3 and the p-type pillar layers 4). Because the impurity concentration in the superjunction structure of the termination region is made lower than that of the device region, the n-type pillar layer 23 and the p-type pillar layer 24 in the termination region is depleted at a lower voltage than in the device region, achieving a higher termination breakdown voltage than in the device region.

The superjunction structure of the device region and the superjunction structure of the termination region are simultaneously formed by a process flow illustrated in FIGS. 3A through 3D.

Figure 3A:
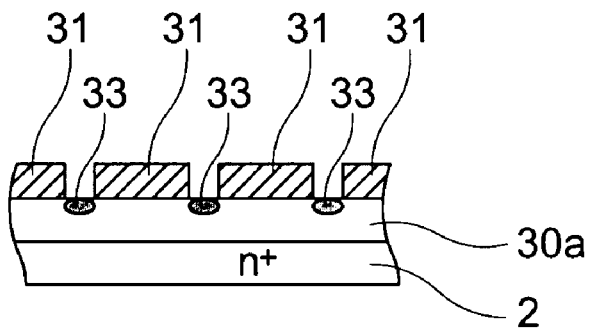
FIGS. 3A through 3D are schematic views illustrating a method for forming a superjunction structure in the embodiments of the invention.
Figure 3B:
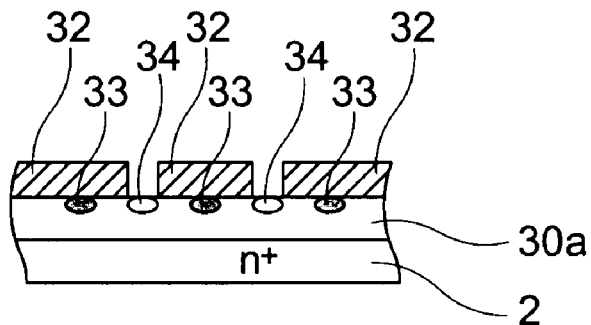
Figure 3C:
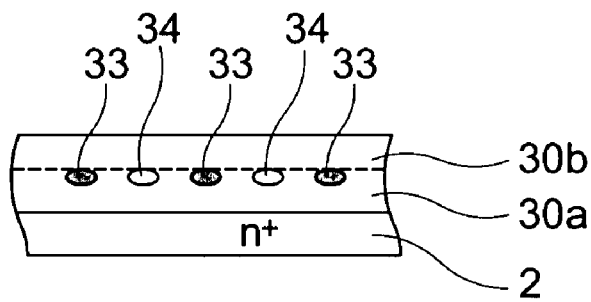
Figure 3D:
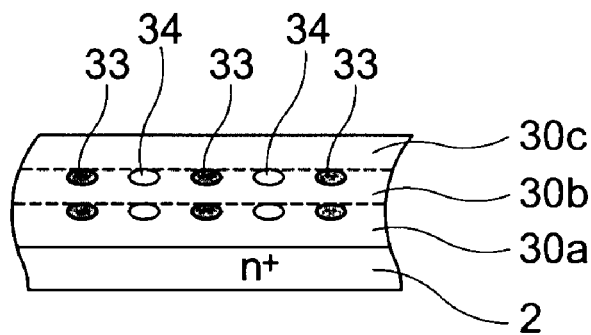

First, as shown in FIG. 3A, using a mask 31 with openings selectively formed therein, impurity such as boron 33 for forming a p-type pillar layer is ion implanted into a high resistance semiconductor layer 30a of n$^-$-type, for example, formed by epitaxial growth on the major surface of a drain layer 2. Next, as shown in FIG. 3B, using another mask 32, impurity such as phosphorus 34 for forming an n-type pillar layer is ion implanted. Subsequently, the ion implanted layer is buried by an n$^-$-type high resistance semiconductor layer 30b as shown in FIG. 3C, and the high resistance semiconductor layer 30b is again subjected to ion implantation as shown in FIG. 3D. This process is repeated a plurality of times.

The structure shown in FIG. 1 is illustratively obtained by six times of epitaxial growth of the high resistance semiconductor layer. However, the number of times of epitaxial growth is not limited thereto, but can be suitably modified depending on the breakdown voltage and target characteristics. Furthermore, the method for forming a superjunction structure is not limited to the method of repeating ion implantation and epitaxial growth a plurality of times. For example, it is also possible to use a method of vertically forming pillar layers by highly accelerated ion implantation into an epitaxial growth layer, or a method of forming trenches in a first-conductivity-type semiconductor layer and performing buried growth of a second-conductivity-type semiconductor layer in the trenches.

Subsequently, heat treatment is performed to diffuse the impurities implanted in the high resistance layers. The diffused regions are vertically linked to form the n-type pillar layers 3, the p-type pillar layers 4, the n-type pillar layers 23, and the p-type pillar layers 24 as shown in FIG. 1. Furthermore, the pillar layers are diffused also laterally, forming a pn junction between the n-type pillar layer and the p-type pillar layer. The pillar layers formed by this method have a plurality of impurity concentration peaks along the vertical direction. The positions of impurity concentration peaks are indicated by dashed lines in FIG. 1.

Outside the termination superjunction structure, a high resistance semiconductor layer 16 of n$^-$-type silicon is provided on the major surface of the drain layer 2. The high resistance semiconductor layer 16 is in contact with the outermost pillar layer in the termination superjunction structure (the outermost pillar layer is a p-type pillar layer 24 in the example shown in FIG. 1, but may be an n-type pillar layer 23).

A channel stop layer 14 for stopping the extension of the depletion layer is provided on the major surface of the drain layer 2 at the outermost periphery outside the high resistance semiconductor layer 16 in the termination region. The inner periphery of the channel stop layer 14 is in contact with the high resistance semiconductor layer 16. The channel stop layer 14 is made of n-type silicon having a higher impurity concentration than the termination semiconductor layers (the n-type pillar layer 23, the p-type pillar layer 24, and the high resistance semiconductor layer 16).

The channel stop layer 14 is formed in the same process as that for the n-type pillar layers 3, 23 described above with reference to FIGS. 3A through 3D. Hence, like the pillar layers, the channel stop layer 14 also has a plurality of impurity concentration peaks along the vertical direction. The positions of impurity concentration peaks are indicated by dashed lines in FIG. 1.

A field insulating film 12 illustratively made of silicon oxide is formed on the surface of the termination region. A channel stop electrode 13 having a ring-shaped planar configuration is provided on the field insulating film 12 at the outermost periphery of the termination region. Part of the surface of the channel stop layer 14 is exposed from the field insulating film 12, and the exposed surface is in contact with part of the channel stop electrode 13. The channel stop electrode 13 is projected toward the high resistance semiconductor layer 16 beyond the channel stop layer 14. That is, the inner periphery of the channel stop electrode 13 is located on the device region side beyond the inner periphery of the channel stop layer 14.

The bottom of the n-type channel stop layer 14 is in contact with the drain layer 2, which is also of n-type. The drain layer 2 has a relatively high impurity concentration. Hence the channel stop layer 14 is connected to the drain electrode 1 through the drain layer 2 and placed at or near the drain potential. The channel stop electrode 13 provided in contact with the channel stop layer 14 is also placed at or near the drain potential.

In the termination region, a field plate electrode 10 is provided in the field insulating film 12 near the device region, and a field plate electrode 11 is provided on the surface of the field insulating film 12 above the field plate electrode 10. The field plate electrode 10 is connected to the field plate electrode 11 through a via formed in the field insulating film 12. The field plate electrodes 10, 11 are connected to the source electrode 9 or the control electrode 8.

When a high voltage is applied to the drain electrode 1, a depletion layer extends from the surface of the semiconductor layer of the termination region provided via the field insulating film 12 below the field plate electrodes 10, 11 connected to the source electrode 9 or the control electrode 8. The depletion layer is joined to the depletion layer extending from the PN junction between the n-type pillar layer 23 and the p-type pillar layer 24 and elongates in the termination region with a curvature centered on the edge of the outermost base region 5a. Thus the electric field is alleviated at the edge of the outermost base region 5a and at the surface of the semiconductor layer of the termination region, where the electric field is particularly likely to concentrate, achieving a high termination breakdown voltage. Furthermore, the decrease of the surface electric field in the termination region prevents the generation of hot carriers, achieving high reliability.

If the depletion layer reaches the top surface or side surface (dicing line) of the chip termination region, it causes leak current and decreases the breakdown voltage. Hence, in this embodiment, the channel stop layer 14 and the channel stop electrode 13 are provided at the chip termination region (the outermost periphery of the termination region) to prevent excessive extension of the depletion layer.

Here, if the depletion layer is abruptly stopped by the channel stop layer 14 while it is insufficiently extended, a point of electric field concentration is likely to occur locally. However, in this embodiment, the channel stop electrode 13, which is provided on the surface of the termination region via the field insulating film 12 and placed at or near the drain potential, is projected inward (toward the high resistance semiconductor layer 16) beyond the channel stop layer 14. Thus an extension margin of the depletion layer can be reserved near the surface of the termination semiconductor layer below the portion of the channel stop electrode 13 projected beyond the channel stop layer 14. Hence the elongation of the depletion layer can be stopped without local electric field concentration. This results in a high termination breakdown voltage, achieving high reliability.

SECOND EMBODIMENT

Figure 4:
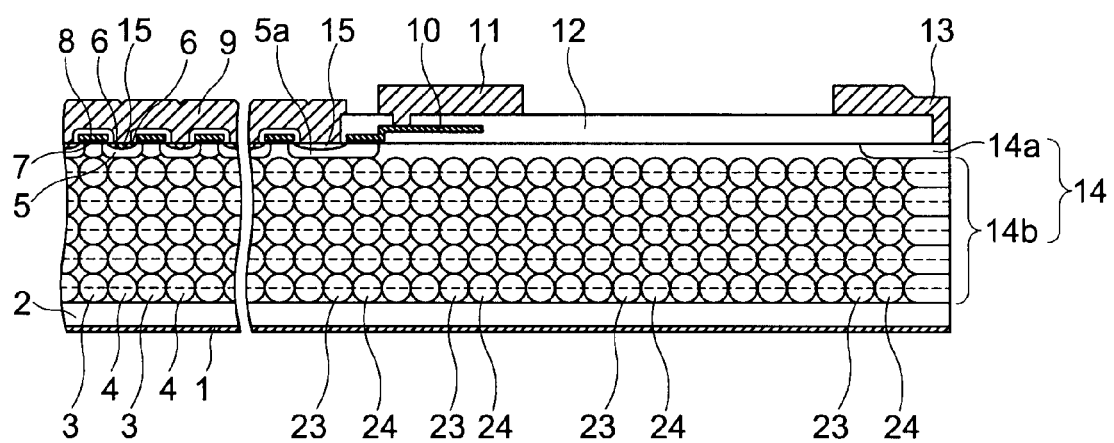
FIG. 4 is a schematic view showing the principal cross-sectional structure of a semiconductor apparatus according to a second embodiment of the invention.

FIG. 4 is a schematic view showing the principal cross-sectional structure of a semiconductor apparatus according to a second embodiment of the invention.

In this embodiment, in contrast to the first embodiment, the periodic array structure (superjunction structure) of the n-type pillar layers 23 and the p-type pillar layers 24 in the termination region is provided also below the channel stop electrode 13. That is, on the device region side, the superjunction structure of the n-type pillar layers 23 and the p-type pillar layers 24 is adjacent to the periodic array structure (superjunction structure) of the n-type pillar layers 3 and the p-type pillar layers 4 in the device region, and on the outermost periphery side of the device termination region, it is adjacent to the channel stop layer 14.

In the channel stop layer 14 of this embodiment, its superficial portion 14a is projected inward beyond its underlying portion 14b. The channel stop electrode 13 is in contact with the superficial portion 14a and projected inward beyond the superficial portion 14a. The portion 14b of the channel stop layer 14 underlying the superficial portion 14a is formed in the same process as that for the superjunction structure in the device region and the termination region described above with reference to FIGS. 3A through 3D, and the vertical positions of impurity concentration peaks (indicated by dashed lines in FIG. 4) coincide with those in the superjunction structure. The top of the p-type pillar layer 24 provided below the superficial portion 14a forms a PN junction with the n-type superficial portion 14a.

Also in this embodiment, the channel stop electrode 13 is projected inward beyond the channel stop layer 14, and hence the elongation of the depletion layer can be stopped without local electric field concentration in the termination region. This results in a high termination breakdown voltage, achieving high reliability. Furthermore, because the channel stop electrode 13 is projected inward and placed also above the superjunction structure of the n-type pillar layers 23 and the p-type pillar layers 24, local electric field concentration can be alleviated despite any imbalance in impurity concentration between the n-type pillar layer 23 and the p-type pillar layer 24.

THIRD EMBODIMENT

Figure 5:
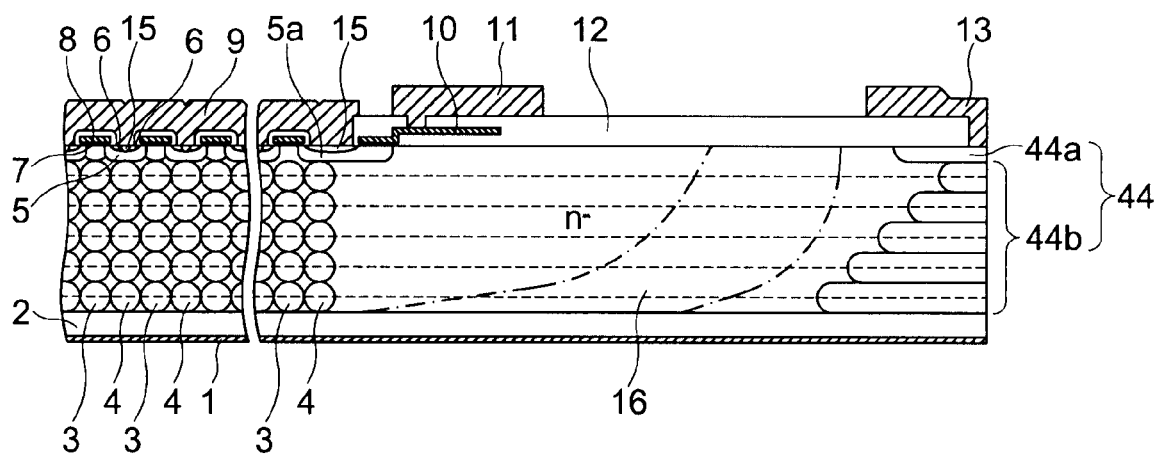
FIG. 5 is a schematic view showing the principal cross-sectional structure of a semiconductor apparatus according to a third embodiment of the invention.

FIG. 5 is a schematic view showing the principal cross-sectional structure of a semiconductor apparatus according to a third embodiment of the invention.

In this embodiment, in the channel stop layer 44, a stepped portion 44b is provided below the superficial portion 44a in contact with the channel stop electrode 13. Like the channel stop layer 14 in the above embodiments, the channel stop layer 44 is made of n-type silicon having a higher impurity concentration than the termination semiconductor layer (which, in this embodiment, has no superjunction structure, but consists only of the high resistance semiconductor layer 16).

The stepped portion 44b of the channel stop layer 44 has a stepped configuration at its inner periphery in contact with the high resistance semiconductor layer 16. In the stepped portion 44b, the top layer in contact with the superficial portion 44a has the smallest amount of projection toward the high resistance semiconductor layer 16, the amount of projection escalates toward the drain layer 2, and the bottom layer in contact with the drain layer 2 has the largest amount of projection.

The stepped portion 44b of the channel stop layer 44 is formed in the same process as that for the superjunction structure in the device region described above with reference to FIGS. 3A through 3D, and the vertical positions of impurity concentration peaks (indicated by dashed lines in FIG. 5) coincide with those in the superjunction structure. The size of a mask opening, which is aligned with the position where the stepped portion 44b is to be formed, is increased as the layer being formed becomes closer to the bottom. Thus the stepped portion 44b can be formed.

The superficial portion 44a of the channel stop layer 44 is projected inward (toward the high resistance semiconductor layer 16) beyond the upper portion (the first and second step in the example shown) in the stepped portion 44b. The middle to lower portion of the stepped portion 44b is projected inward beyond the superficial portion 44a. The channel stop electrode 13 is projected inward beyond the superficial portion 44a. Thus the overall cross-sectional configuration of the channel stop electrode 13 and the channel stop layer 44 is shaped like the ">" symbol.

The depletion layer elongates with a curvature centered on the edge of the outermost base region 5a as indicated by dot-dashed lines in FIG. 5, and alleviates the electric field acting on the edge of the outermost base region 5a, where the electric field is particularly likely to concentrate. Hence the elongation of the depletion layer is not needed in the region near the bottom of the outermost portion of the termination region. Conversely, if the depleted region is unnecessarily elongated into this region, it may cause local electric field concentration and current leakage.

In this embodiment, the channel stop layer 44 is provided with a stepped portion 44b as described above so that the depletion layer can be stopped in accordance with its curvature. This prevents unnecessary elongation of the depletion layer not contributing to enhancing the breakdown voltage. That is, the portion of the termination region needed to enhance the breakdown voltage can be efficiently depleted, achieving high reliability.

Furthermore, the channel stop electrode 13 and the superficial portion 44a of the channel stop layer 44 are projected inward beyond the middle portion of the channel stop layer 44 so that the portion of the outermost periphery of the termination region to be placed at or near the drain potential is entirely shaped like the ">" symbol. Thus electric field concentration on the surface of the termination region can be alleviated while preventing unnecessary elongation of the depletion layer to the bottom of the termination region.

FOURTH EMBODIMENT

Figure 6:
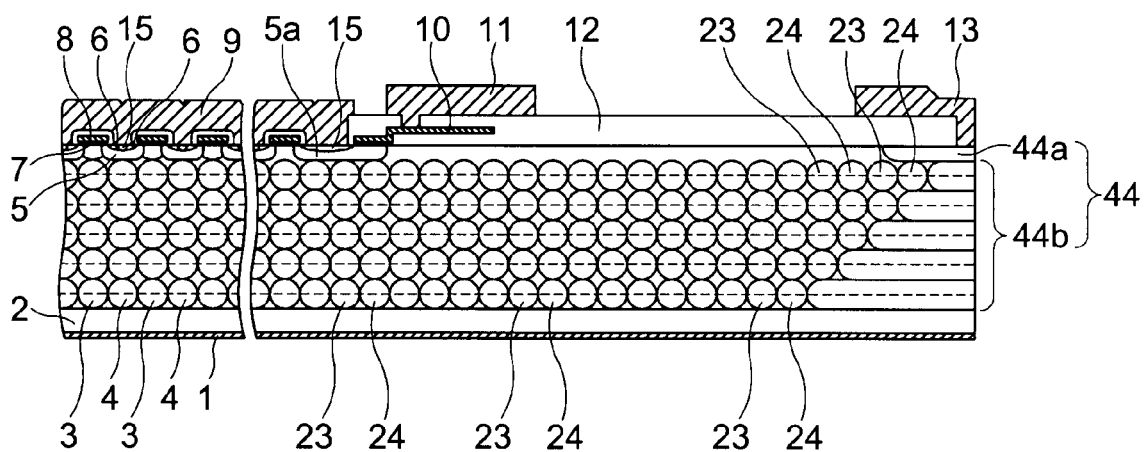
FIG. 6 is a schematic view showing the principal cross-sectional structure of a semiconductor apparatus according to a fourth embodiment of the invention.

FIG. 6 is a schematic view showing the principal cross-sectional structure of a semiconductor apparatus according to a fourth embodiment of the invention. This embodiment has a combined structure of the second embodiment shown in FIG. 4 and the third embodiment shown in FIG. 5.

More specifically, the channel stop electrode 13 and the superficial portion 44a and the lower portion of the channel stop layer 44 are projected inward beyond the middle portion of the channel stop layer 44 so that the portion of the outermost periphery of the termination region to be placed at or near the drain potential is entirely shaped like the ">" symbol. Thus electric field concentration on the surface of the termination region can be alleviated while preventing unnecessary elongation of the depletion layer to the bottom of the termination region.

Furthermore, the periodic array structure (superjunction structure) of the n-type pillar layers 23 and the p-type pillar layers 24 in the termination region is provided also below the channel stop electrode 13 and made adjacent to the channel stop layer 44. That is, because the channel stop electrode 13 is projected inward and placed also above the superjunction structure of the n-type pillar layers 23 and the p-type pillar layers 24, local electric field concentration can be alleviated despite any imbalance in impurity concentration between the n-type pillar layer 23 and the p-type pillar layer 24.

FIFTH EMBODIMENT

Figure 7:
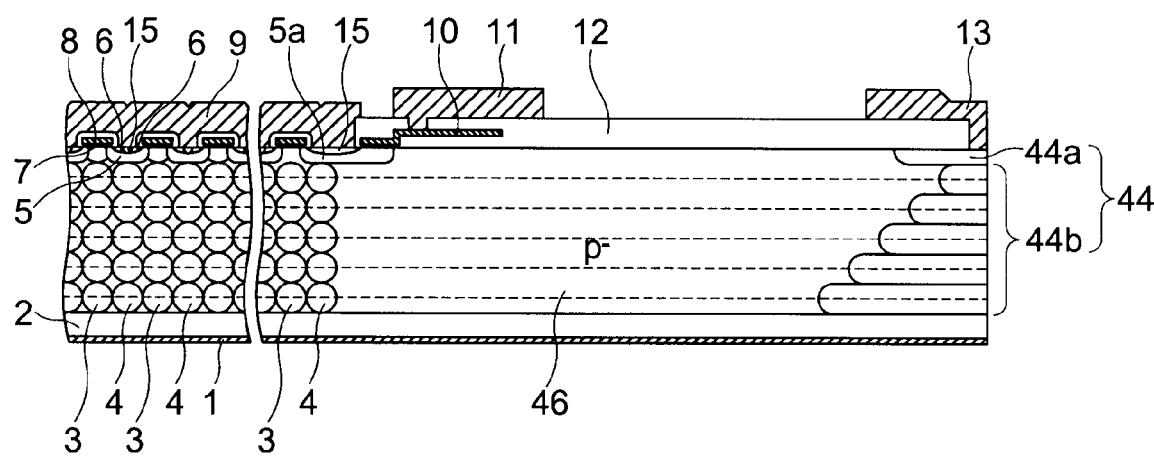
FIG. 7 is a schematic view showing the principal cross-sectional structure of a semiconductor apparatus according to a fifth embodiment of the invention.

FIG. 7 is a schematic view showing the principal cross-sectional structure of a semiconductor apparatus according to a fifth embodiment of the invention.

The semiconductor apparatus according to this embodiment is different in the configuration of the termination semiconductor layer from the semiconductor apparatus according to the third embodiment shown in FIG. 5. That is, in the termination semiconductor layer of this embodiment, a $p^-$-type high resistance semiconductor layer 46 is used instead of the $n^-$-type high resistance semiconductor layer 16 as shown in FIG. 5.

By using a $p^-$-type termination semiconductor layer (high resistance semiconductor layer 46), a depletion layer extends in the termination region from the PN junction between the $p^-$-type high resistance semiconductor layer 46 and the $n^+$-type drain layer 2 and the PN junction between the $p^-$-type high resistance semiconductor layer 46 and the n-type channel stop layer 44. Thus a wide area of the termination region is easily depleted, achieving a termination structure having a higher breakdown voltage than the case where an $n^-$-type semiconductor layer is used as the termination semiconductor layer.

It is noted that the high resistance semiconductor layer 16 may be of $p^-$-type rather than $n^-$-type also in the semiconductor apparatus according to the first embodiment shown in FIG. 1.

SIXTH EMBODIMENT

Figure 8:
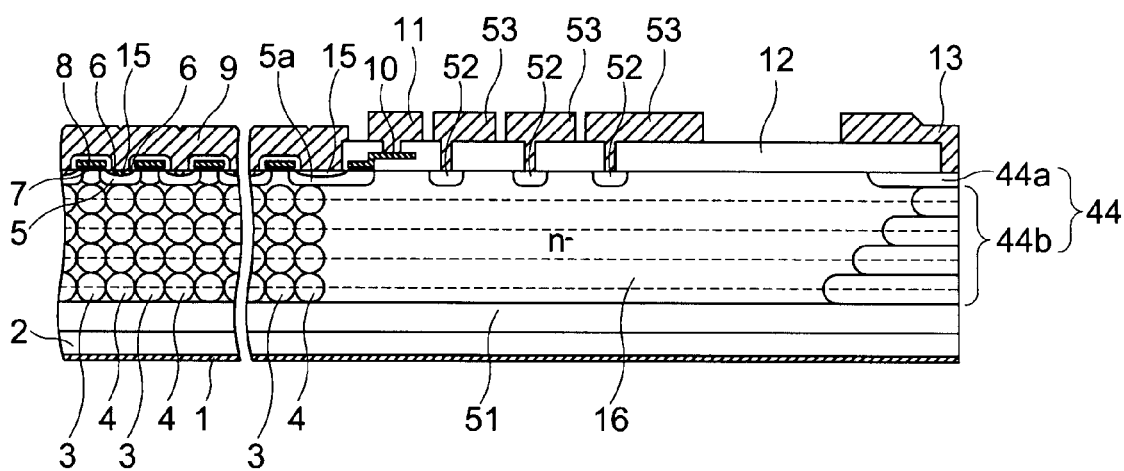
FIG. 8 is a schematic view showing the principal cross-sectional structure of a semiconductor apparatus according to a sixth embodiment of the invention.

FIG. 8 is a schematic view showing the principal cross-sectional structure of a semiconductor apparatus according to a sixth embodiment of the invention.

In this embodiment, a buffer layer 51 illustratively made of $n^-$-type silicon having a lower impurity concentration than the n-type pillar layer 3 of the device region is provided between the superjunction structure of the device region (the n-type pillar layers 3 and the p-type pillar layers 4) and the drain layer 2, between the high resistance semiconductor layer 16 of the termination region and the drain layer 2, and between the channel stop layer 44 and the drain layer 2. Hence, during application of high voltage, the depletion layer extends to the buffer layer 51, which can also serve to hold the voltage. Thus, because the voltage is held by both the super-junction structure and the buffer layer 51, a high breakdown voltage is easily achieved. It is noted that the buffer layer 51 is also applicable to the structure of the first to fifth embodiment.

Furthermore, in this embodiment, a p-type field limited ring layer 52 is selectively provided on the surface of the termination region (the surface of the high resistance semiconductor layer 16) outside the field plate electrodes 10, 11. Moreover, a field plate electrode 53 in contact with the field limited ring layer 52 through a via is provided on the surface of the field insulating film 12 above the field limited ring layer 52. This structure can facilitate the elongation of the depletion layer in the termination region.

In the above embodiments, in the case where the termination region has no superjunction structure (consists only of the high resistance semiconductor layer 16 or 46), it is possible to prevent the decrease of breakdown voltage due to imbalance in impurity concentration between the n-type pillar layer and the p-type pillar layer. The termination region does not affect the on-resistance because the main current path is not produced therein during on-time. Hence it may be an n$^-$-type or p$^-$-type high resistance semiconductor layer having higher resistance than the n-type pillar layer 3, which serves as a current path during on-time. In the case where the termination region has no superjunction structure, the extension of the depletion layer in the superjunction structure is unavailable. Hence the concentration in the high resistance semiconductor layer 16 or 46 needs to be minimized in order to achieve higher breakdown voltage than in the device region. For example, the impurity concentration in the high resistance semiconductor layer 16 or 46 is preferably $10^{14}$ cm$^{-3}$ or less.

The embodiments of the invention have been described with reference to the examples. However, the invention is not limited thereto, but can be variously modified within the spirit of the invention.

In the above embodiments, it is assumed that the first conductivity type and the second conductivity type are n-type and p-type, respectively. However, the invention is practicable also when the first conductivity type and the second conductivity type are p-type and n-type, respectively.

While the planar gate structure is described in the above embodiments, a trench gate structure may also be used. Furthermore, while the above description is made with reference to MOSFETs, the invention is also applicable to any devices such as an SBD (Schottky barrier diode), a pin diode, and an IGBT (insulated gate bipolar transistor).

The channel stop electrode 13 is illustratively made of polycrystalline silicon or metal. The semiconductor is not limited to silicon, but may alternatively be silicon carbide (SiC), gallium nitride (GaN), or diamond, for example.

The invention claimed is:

1. A semiconductor apparatus comprising:
a first semiconductor layer of a first conductivity type;
a second semiconductor layer of the first conductivity type provided on a major surface of the first semiconductor layer in a device region in which a main current path is produced in a vertical direction generally perpendicular to the major surface of the first semiconductor layer;
a third semiconductor layer of a second conductivity type provided on the major surface of the first semiconductor layer and being adjacent to the second semiconductor layer;
a first main electrode provided on a surface of the first semiconductor layer opposite to the major surface thereof;
a second main electrode provided in contact with a surface of the device region;
a termination semiconductor layer provided on the major surface of the first semiconductor layer in a termination region outside the device region;
a channel stop layer of the first conductivity type provided in contact with the termination semiconductor layer on the major surface of the first semiconductor layer in an outermost peripheral portion outside the termination semiconductor layer and having a higher impurity concentration than the termination semiconductor layer; and
a channel stop electrode provided on at least part of a surface of the channel stop layer and projected toward the termination semiconductor layer beyond at least a superficial portion of the channel stop layer.

2. The semiconductor apparatus according to claim 1, wherein the channel stop layer is connected to the first main electrode via the first semiconductor layer.

3. The semiconductor apparatus according to claim 1, wherein a part of the channel stop electrode is in contact with the surface of the channel stop layer.

4. The semiconductor apparatus according to claim 1, wherein the superficial portion of the channel stop layer projects toward the termination semiconductor layer beyond a portion which is provided below the superficial portion.

5. The semiconductor apparatus according to claim 1, wherein the channel stop electrode has a ring-shaped planar configuration, and an inner periphery of the channel stop electrode projects toward the termination semiconductor layer beyond an inner periphery of the channel stop layer.

6. The semiconductor apparatus according to claim 1, wherein the termination semiconductor layer has a periodic array structure of fourth semiconductor layers of the first conductivity type provided on the major surface of the first semiconductor layer and fifth semiconductor layers of the second conductivity type, each of the fifth semiconductor layers being adjacent to the fourth semiconductor layer.

7. The semiconductor apparatus according to claim 6, wherein impurity concentrations of the fourth semiconductor layer and the fifth semiconductor layer are lower than impurity concentrations of the second semiconductor layer and the third semiconductor layer.

8. The semiconductor apparatus according to claim 6, wherein a high resistance semiconductor layer having a lower impurity concentration than the fourth semiconductor layers and the fifth semiconductor layers is provided outside the periodic array structure of the fourth semiconductor layers and the fifth semiconductor layers.

9. The semiconductor apparatus according to claim 6, wherein the periodic array structure of the fourth semiconductor layers and the fifth semiconductor layers is in contact with the channel stop layer.

10. The semiconductor apparatus according to claim 6, wherein the termination semiconductor layer has the periodic array structure provided from the device region side to below the channel stop electrode and composed of the fourth semiconductor layers of the first conductivity type and the fifth semiconductor layers of the second conductivity type adjacent to the fourth semiconductor layer.

11. The semiconductor apparatus according to claim 6, wherein the periodic array structure of the fourth semiconductor layers and the fifth semiconductor layers is provided from the device region side to below the channel stop electrode, the channel stop layer has a stepped portion escalating an amount of projection toward the termination semiconductor layer toward the first semiconductor layer.

12. The semiconductor apparatus according to claim 1, wherein the channel stop layer includes a stepped portion in which an amount of projection toward the termination semiconductor layer increases toward the first semiconductor layer.

13. The semiconductor apparatus according to claim 12, wherein the channel stop layer includes the superficial portion and a stepped portion provided below the superficial portion, in the stepped portion, a top layer in contact with the superficial portion has the smallest amount of projection toward the termination semiconductor layer, a bottom layer in contact with the first semiconductor layer has the largest amount of projection toward the termination semiconductor layer, a portion between the top layer and the bottom layer has the amount of projection toward the termination semiconductor layer escalating toward the first semiconductor layer.

14. The semiconductor apparatus according to claim 1, wherein the termination semiconductor layer is of the second conductivity type.

15. The semiconductor apparatus according to claim 1, further comprising:

a buffer layer of the first conductivity type provided on the first semiconductor layer and being in contact with the second semiconductor layer, the third semiconductor layer, the termination semiconductor layer, and the channel stop layer.

16. The semiconductor apparatus according to claim 1, wherein the second semiconductor layer and the third semiconductor layer have a plurality of peaks of impurity concentration in the perpendicular direction.

17. The semiconductor apparatus according to claim 6, wherein the fourth semiconductor layer and the fifth semiconductor layer have a plurality of peaks of impurity concentration along the perpendicular direction.

18. The semiconductor apparatus according to claim 1, wherein the channel stop layer has a plurality of peaks of impurity concentration along the perpendicular direction.

19. The semiconductor apparatus according to claim 1, wherein a base region of the second conductivity type is provided on the third semiconductor layer in the device region, a source region of the first conductivity type is selectively provided in a surface of the base region, and a control electrode is provided via an insulating film on a portion extending from the second semiconductor layer through the base region to the source region.

20. The semiconductor apparatus according to claim 19, wherein a field plate electrode connected to the source electrode or the control electrode is provided on a surface of the termination region.

* * * * *